(12) United States Patent
Mauldin

(10) Patent No.: US 11,494,705 B1
(45) Date of Patent: Nov. 8, 2022

(54) SOFTWARE PATH PREDICTION VIA MACHINE LEARNING

(71) Applicant: NLevel Software LLC, Cedar Park, TX (US)

(72) Inventor: Chad Mauldin, New Ipswich, NH (US)

(73) Assignee: NLEVEL SOFTWARE LLC, Cedar Park, TX (US)

( * ) Notice: Subject to any disclaimer, the term of this patent is extended or adjusted under 35 U.S.C. 154(b) by 0 days.

(21) Appl. No.: 17/452,703

(22) Filed: Oct. 28, 2021

Related U.S. Application Data

(63) Continuation of application No. 17/450,757, filed on Oct. 13, 2021.

(51) Int. Cl.
| | |
|---|---|
| *G06N 20/20* | (2019.01) |
| *G06F 16/2455* | (2019.01) |
| *A63F 13/00* | (2014.01) |
| *G07F 17/32* | (2006.01) |

(52) U.S. Cl.
CPC ............. *G06N 20/20* (2019.01); *A63F 13/00* (2013.01); *G06F 16/24568* (2019.01); *G07F 17/32* (2013.01)

(58) Field of Classification Search
CPC ..... A63F 13/00; G07F 17/32; G06F 16/24568
See application file for complete search history.

(56) References Cited

U.S. PATENT DOCUMENTS

| | | | |
|---|---|---|---|
| 10,357,718 | B2 | 7/2019 | Aghdaie et al. |
| 10,839,215 | B2 | 11/2020 | Somers et al. |
| 10,905,962 | B2 | 2/2021 | Kaethler et al. |
| 10,918,941 | B2 | 2/2021 | Kolen et al. |
| 11,052,311 | B2 | 7/2021 | Bleasdale-Shepherd et al. |
| 2017/0259177 | A1* | 9/2017 | Aghdaie ............... G06Q 30/02 |
| 2019/0286994 | A1 | 9/2019 | Bhoj et al. |
| 2019/0287004 | A1 | 9/2019 | Bhoj et al. |
| 2021/0001229 | A1 | 1/2021 | Somers et al. |
| 2021/0141729 | A1* | 5/2021 | Rao ..................... G06F 12/0848 |

* cited by examiner

*Primary Examiner* — Shirley X Zhang
(74) *Attorney, Agent, or Firm* — Klemchuk LLP

(57) ABSTRACT

Disclosed are a computer system, a software path prediction computer, non-transitory computer-readable medium, and method for determining a predicted software path that utilize segmentation machine learning in combination with ensemble machine learning to keep a most accurate model running on a server program that receives requests from and sends predicted software path(s) to a software client.

15 Claims, 4 Drawing Sheets

SOFTWARE PATH PREDICTION VIA MACHINE LEARNING

FIELD

The present disclosure generally relates to software that executes via a sequence of software paths, and more particularly, to determining a next software path for software that executes the sequence of software paths.

BACKGROUND

Software executes to perform a particular function for the user of the software. In some instances, software can execute a sequence of paths to achieve the particular function. The sequence of paths can be preset in the software; however, preset paths may not adequately engage all users of the software. That is, a one-size-fits-all software path sequence may engage some users for the entire path sequence, and yet not engage many more users, leading to disengagement from the software. For example, a video game can execute various gaming levels that are preset. Gamers have varying skill levels, and some gamers may find the software paths of the video game too easy, while many other gamers may get stuck on a level and disengage.

One solution to one-size-fits all software path sequences is to customize the software experience for a particular user. For example, gaming data can be used to customize game parameters that keep a gamer engaged with the videogame software for a longer period of time. In another example, machine learning can be performed on segmented data to customize game parameters for a gamer, to keep the gamer engaged for a longer period of time. More accurate customization of a software path sequence for a particular user of the software is an ongoing pursuit.

SUMMARY

Disclosed are a computer system, a software path prediction computer, non-transitory computer-readable medium, and method for determining a predicted software path.

The method can include performing a segmentation machine learning model on a time segmented data batch (TSDB) to obtain a segmentation output; performing each of a plurality of machine learning models in an ensemble machine learning model on an input data set comprising the TSDB and the segmentation output; selecting a first machine learning model from the plurality of machine learning models in the ensemble machine learning model as a most accurate model based on the step of performing each of the plurality of machine learning models in the ensemble machine learning model on an input data set; loading the first machine learning model onto a server program as the most accurate model; and performing, by the server program, the most accurate model on a feature set to obtain an output comprising a predicted software path for a software client.

The computer system can include a software path prediction computer having a first datastore, a second datastore, and a server program running thereon. The software path prediction computer is configured to: perform a segmentation machine learning model on a time segmented data batch (TSDB) to obtain a segmentation output; perform each of a plurality of machine learning models in an ensemble machine learning model on an input data set comprising the TSDB and the segmentation output; select a first machine learning model from the plurality of machine learning models in the ensemble machine learning model as a most accurate model based on the step of performing each of the plurality of machine learning models in the ensemble machine learning model on an input data set; and load the first machine learning model onto a server program as the most accurate model; wherein the server program is configured to perform the most accurate model on a feature set to obtain an output comprising a predicted software path for a software client.

A non-transitory computer-readable medium storing computer readable instructions that, when executed by one or more computing devices, causes the one or more computing devices to perform operations comprising: performing a segmentation machine learning model on a time segmented data batch (TSDB) to obtain a segmentation output; performing each of a plurality of machine learning models in an ensemble machine learning model on an input data set comprising the TSDB and the segmentation output; selecting a first machine learning model from the plurality of machine learning models in the ensemble machine learning model as a most accurate model based on the step of performing each of the plurality of machine learning models in the ensemble machine learning model on an input data set; loading the first machine learning model onto a server program as the most accurate model; and performing, by the server program, the most accurate model on a feature set to obtain an output comprising a predicted software path for a software client.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
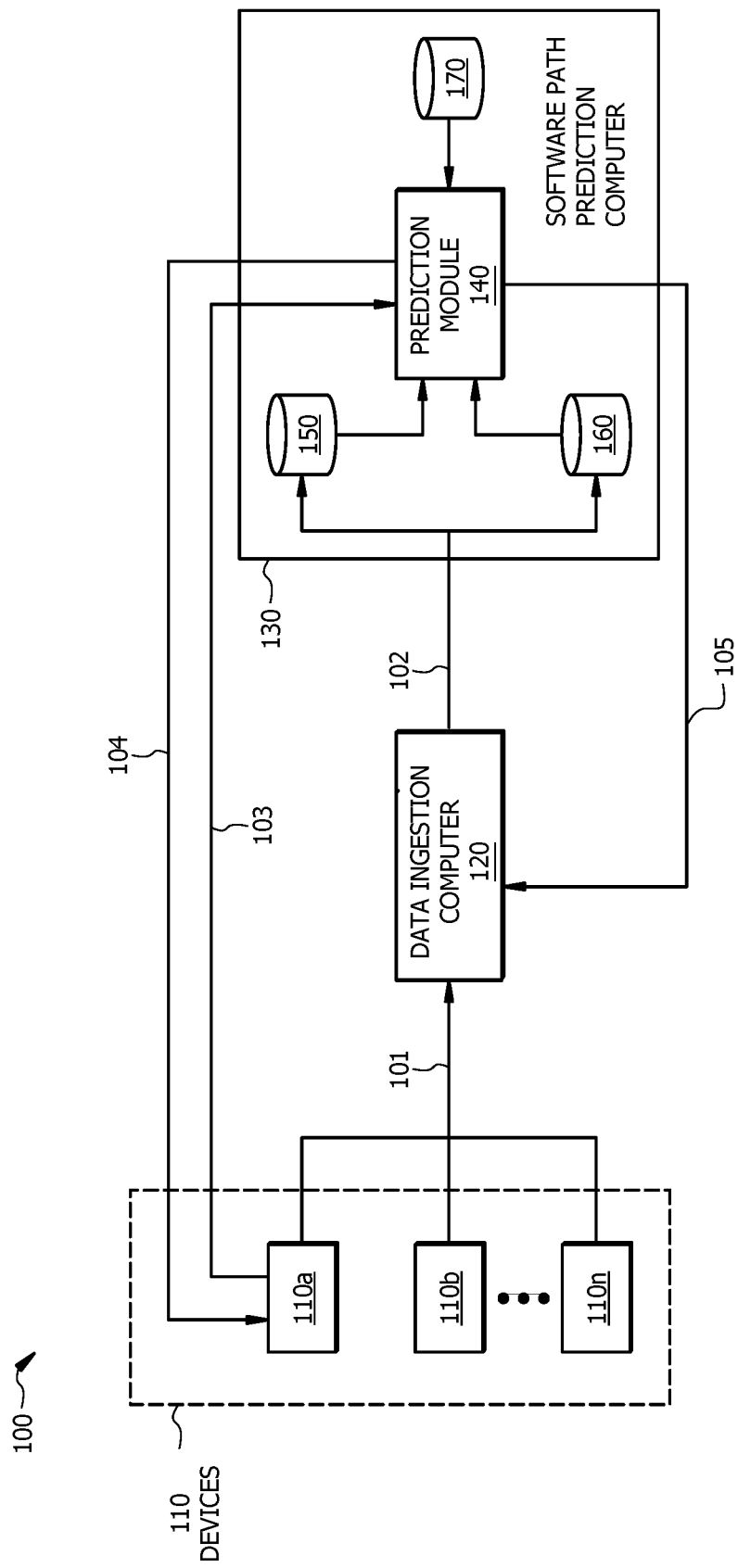
FIG. 1 illustrates a block diagram of a computing system according to the disclosure.

It should be understood at the outset that although an illustrative implementation of one or more embodiments are provided below, the disclosed computer system, computer, non-transitory computer-readable medium, and/or method may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

The term "software customer" as used herein refers to the software that is loaded onto user devices for a particular function or set of functions. For example, a "software customer" can be a video game or tutorial app. Video game X is a different software customer than video game Y, within the scope of this disclosure.

The term "software client" as used herein refers to software executing on a device and is a client program for the server program disclosed herein. The device that executes the software client can be a smartphone, tablet, laptop, desktop computer, or a combination thereof. A "software client" that has software of a software customer on one device is different than the "software client" that has software of the same software customer on another device. Moreover, a "software client" that has software of a first software customer on one device is different than the "software client" that has software of a second software customer on another device. Moreover still, all software clients of devices having software of a first software customer are different software clients than all software clients of devices having software of a second software customer.

The term "software event data" as used herein refers to data that represents information about the user of the software client running on a device of the user. Nonlimiting examples of software event data include user identifier, user age, device geographic location, user play time per game, user play time per day or week or month or year, user skill level, identity of software used, number of different software used, types of software used, historical sequence of software paths taken by the user, or combinations thereof. Any of the software event data can be associated with any other of the software event data. For example, the user identifier can be associated with the identity of software used. In another example, the historical sequence of software paths can be associated with the user identifier and optionally with the identity of the software, software customer, software client, or combinations thereof that are used.

The term "user identifier" as used herein can refer to a data string, such as a string of alpha numeric characters. The data string is assigned to a user of the device running software that is a software client of the software path prediction computer disclosed herein or assigned to a device running software that is a software client of the software path prediction computer disclosed herein.

Disclosed are a computer system, a software path prediction computer, non-transitory computer-readable medium, and method for determining a predicted software path. The disclosed computer system, software path prediction computer, non-transitory computer-readable medium, and method utilize segmentation machine learning in combination with ensemble machine learning to keep a most accurate model running on a server program that receives requests from and sends predicted software path(s) to a software client. Additionally, different types of datastores are utilized to enable the combination of machine learning processing disclosed herein: a first datastore stores compressed time series real-time event data that is batched for input to a segmentation machine learning model that produces a segmentation output for the ensemble machine learning model from which the most accurate model is selected; and a second datastore is a fast-access datastore from which uncompressed data unique to a user of a software client can be quickly accessed and retrieved by the server program in order to build a feature set for input to the most accurate model running on the server program. The most accurate model determines predicted software paths based on input of the feature set customized for the user of the software client.

Conventionally, a software proceeds through a sequence of predetermined software paths for all users of the software. Variations on the conventional sequence include user-choice of next path, where the software can prompt the user to choose from several software path options, and the software then proceeds with a path chosen by the user. In the disclosed computer system, computer, non-transitory computer-readable medium, and method, the software path sequence is chosen by the software client based on predicted software path(s) determined at the server level by machine learning performed on the disclosed computer system, computer, non-transitory computer-readable medium, and method as disclosed herein.

Moreover, the predicted software paths are determined at the server level and not at the software client level; thus, freeing user devices from needing processing power to determine predicted software paths. Moreover still, by placing the predicted software path determination at the server level, software path prediction processing can be easily scaled up and down on the server level according to software client demand. For example, processing load can be easily adjusted by using cloud processing scalability. Further, the disclosed computer system, computer, non-transitory computer-readable medium, and method determine predicted software paths at a higher accuracy than software paths predicted based only on segmented data, at least because a most accurate model is chosen from an ensemble machine learning model based on segmented data input, and then most accurate model is loaded on a server program and performed on a feature set that is unique to the user of the software client to determine the predicted software path(s). Thus, the predicted software path(s) are significantly fewer in number and more accurate to the user of the software client compared with segmentation-level-only prediction.

FIG. 1 illustrates a block diagram of a computer system 100 according to the disclosure. The computer system 100 of FIG. 1 can include one or more user devices 110 (e.g., illustrated as user device 110a, user device 110b, and user device 110n, wherein n represents any number of devices), a data ingestion computer 120, and a software path prediction computer 130. Each of the devices 110 can be networked with the data ingestion computer 120 and the software path prediction computer 130, and the data ingestion computer 120 can additionally be networked with the software path prediction computer 130.

Each of the components 110, 120, and 130 shown in FIG. 1 can be embodied with computer equipment such as one or more processors, memory (e.g., non-transitory computer readable medium), datastore(s), networking cards or interfaces, and other equipment for receiving, processing, storing, and sending data according to the functionality described herein.

The networking between any two of components 110, 120, and 130 of the computer system 100 can be embodied as any wired internet connection, wireless internet connection, local area network (LAN), wired intranet connection, wireless intranet connection, or combinations thereof. Wireless internet connections can include a Global System for Mobile Communications (GSM), Code-division multiple access (CDMA), General Packet Radio Service (GPRS), Evolution-Data Optimized (EV-DO), Enhanced Data Rates for GSM Evolution (EDGE), Universal Mobile Telecommunications System (UMTS), or combinations thereof.

Each of the devices 110a, 110b, and 110n can generally execute a software client. The software clients executed by devices 110 can be the same or different. In embodiments, some (e.g., device 110a) of the devices 110 can execute one software client while other (e.g., device 110b) of the devices 110 can execute another, different software client. Each of the devices 110a, 110b, and 110n is configured to output software event data for the software client running on each of the devices 110. For example, video gaming software may run on each device 110a, 110b, and 110n, and the actions taken by the user of each device 110a, 110b, and 110n can generate data that can be sent by the software client in data stream 101 to the data ingestion computer 120. Another example can be tutorial software for any subject matter (e.g., changing a car battery, playing drums, building a house), in which tutorials may run on each of the devices, and the actions taken by the user of each device 110a, 110b, and 110n can generate software event data that can be sent by the software client(s) in data stream 101 to the data ingestion computer 120. The collective event data from all devices 110 can continuously or discontinuously stream to the data ingestion computer 120 via data stream 101.

In embodiments, each device 110a, 110b, and 110n can be configured to associate any of the software event data unique to the device 110a, 110b, or 110n with any other software event data unique to the device 110a, 110b, or 110n. For example, a user identifier that is unique to the device 110a can be associated with the identity of software running on the device 110a, and the association can be included as part of the software event data streamed from device 110a. In another example, the historical sequence of software paths taken by a user of the device 110a running the software can be associated with the user identifier and optionally with the identity of the software used, and the association can be included as part of the software event data streams from device 110a.

The data ingestion computer 120 can be configured time stamp (if not already time stamped by the devices 110) the software event data received from each of the devices 110. The data ingestion computer 120 can be configured to send a stream 102 of the time series real-time software event data to the software path prediction computer 130; alternatively, the data ingestion computer 120 can be configured to allow the software path prediction computer 130 to retrieve time series real-time software event data from the data ingestion computer 120. In embodiments, the data ingestion computer 120 can simultaneously store the software event data received via stream 101 in one or more datastores networked with or included within the data ingestion computer 120 and send the stream 102 of time series real-time software event data to the software path prediction computer 130. The amount of software event data that can flow in stream 101 can be large in quantity, and the data ingestion computer 120 can be configured to aggregate the software event data in such a way as to convert the data into a format that is processable in the software path prediction computer 130. The format suitable herein is referred to as time series real-time software event data (TSRTSED).

In embodiments, the data ingestion computer 120 is configured to convert the software event data to TSRTSED by a technique referred to as extraction, transformation, and loading (ETL). In context of data ingestion computer 120, extraction is the task of acquiring and aggregating the software event data from the devices 110 via stream 101. Transformation can include cleaning the software event data, such as by associating event data with a time stamp, capping minimum value of an event parameter, capping a maximum value of an event parameter, filling a gap (a missing value) in the values for an event parameter, removing an impossible value for an event parameter, normalizing data values between 0 and 1, add associations between software event data, remove false associations between software event data, or combinations thereof. Loading can include storing transformed event data in one or more datastores of the data ingestion computer 120.

In embodiments where the device 110a (used as example and applicable to any of devices 11) does not associate some or all of the software event data generated by before streaming to the data ingestion computer 120, the data ingestion computer 120 can be configured to generation association during the transformation task. For example, the data ingestion computer 120 can associate a user identifier that is unique to the device 110a with the identity of software running on the device 110a, and the association can be included as part of the TSRTSED. In another example, the data ingestion computer 120 can associate the historical sequence of software paths taken by a user of the device 110a running the software with the user identifier and optionally with the identity of the software used, and the association can be included as part of the TSRTSED.

The data ingestion computer 120 can be located entirely in the cloud, partially in the cloud (e.g., having portions on the edge and/or in locally stored datastore), or entirely local.

The software path prediction computer 130 is configured to receive or retrieve the TSRTSED from the data ingestion computer 120 via stream 102, to receive a request 103 for a predicted software path from one of the devices 110 (e.g., device 110a) running a software client, and to send a software path prediction(s) 104 to the one of the devices 110 (e.g., device 110a) that made the request. The software path prediction computer 130 can receive or retrieve the TSRTSED concurrently, independently, or concurrently and independent from receiving the request 103 and sending the prediction(s) 104 to one of the devices 110. Generally, the SPPC 130 can send the prediction(s) 104 in response to receiving the request 103.

The software path prediction computer 130 can generally include one or more processors, one or more datastores (e.g., datastore 150, datastore 160, and optional datastore 170, each described in more detail herein), and one or more memory (e.g., non-transitory computer readable medium) having instructions stored thereon that cause the one or more processors to i) store the TSRTSED received in stream 102 in datastore 150 and in datastore 160; ii) receive the request 103, iii) execute the prediction module 140 in response to receiving the request 103 and to produce a predicted software path(s), iv) send the predicted software path(s) 104 to the requesting device (e.g., device 110a in FIG. 1), v) send feedback 105 containing the predicted software path(s) and an optional association of the path(s) with the user identifier to the data ingestion computer 120, or vi) combinations of i)-v). The datastore arrangement and software architecture of the prediction module 140 in the software path prediction computer 130 are described in more detail in the description for FIG. 2. The software path prediction computer 130 can be located entirely in the cloud, partially in the cloud (e.g., having portions on the edge and/or in locally stored datastore), or entirely local.

After receiving the predicted software path(s) 104 from the software path prediction computer 130, the requesting device (e.g., device 110a in FIG. 1) can execute the predicted software path(s) as the next software path(s) for the user of the requesting device (e.g., device 110a in FIG. 1). In some embodiments, the device 110a can execute all the predicted software paths received, in a sequence. In other embodiments, the software on the device 110a can be configured to choose one or more software paths from the received predicted software path(s) and then execute the chosen path(s).

Figure 2:
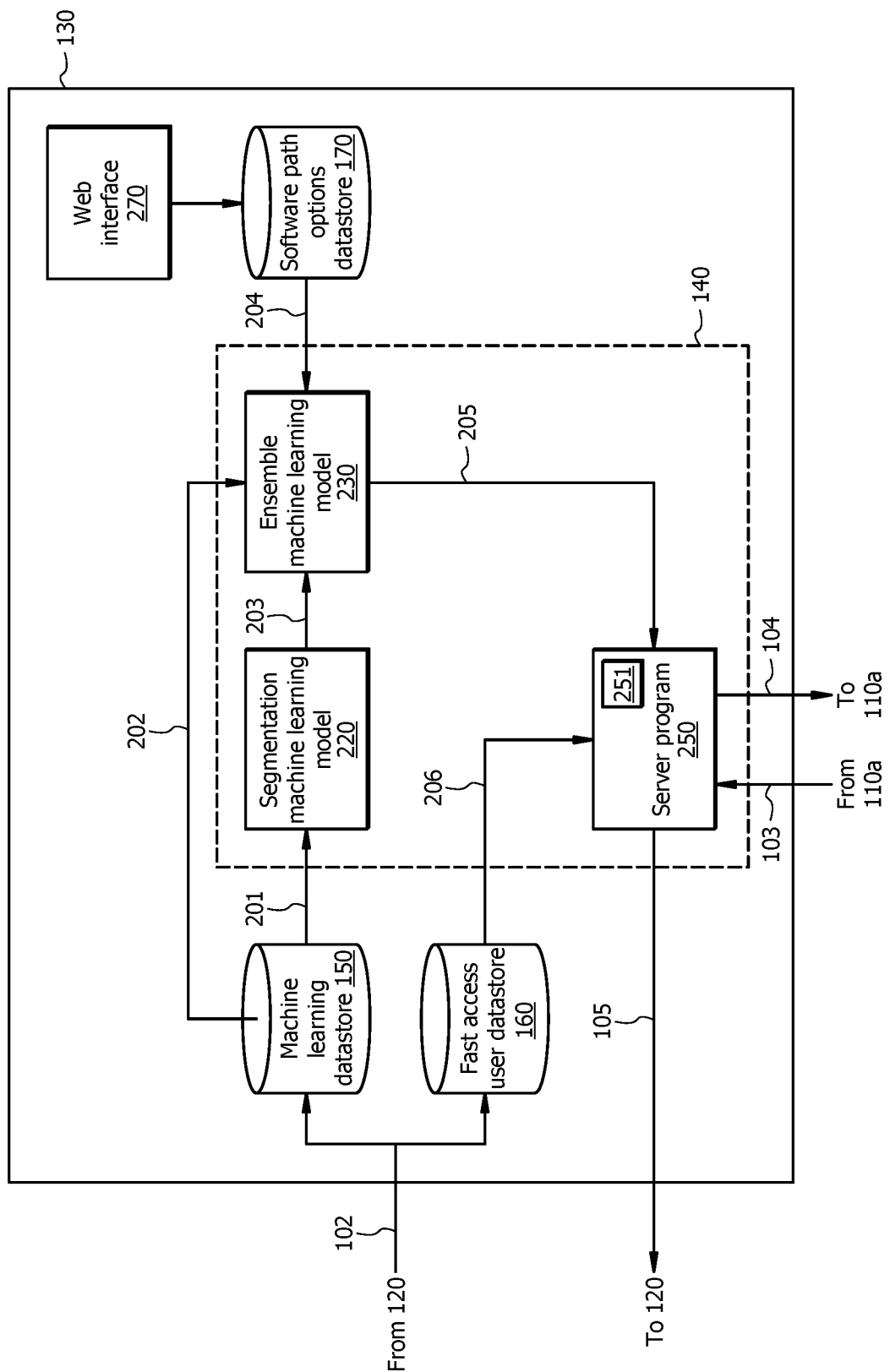
FIG. 2 illustrates a block diagram of software executed by the software path prediction computer according to the disclosure.

FIG. 2 illustrates a block diagram of software executed by the software path prediction computer 130 according to the disclosure. It should be appreciated that other software not described herein may be contained on and executed by the software path prediction computer 130; alternatively, the software described herein is the only software contained on and executed by the software path prediction computer 130. The functions described for the components in FIG. 2 may refer to components of the computer system 100 in FIG. 1.

As can be seen, the software path prediction computer 130 has several components, including a first datastore 150, a segmentation machine learning (ML) model 220, an ensemble ML model 230, a second datastore 160, and a server program 250. In embodiments, the software path prediction computer 130 can additionally include a software path options datastore 170, and a web interface 270. In FIG. 2, the data ingestion computer 120 is illustrated as not being part of the software path prediction computer 130; however, alternative embodiments contemplate that the data ingestion computer 120 can be part of the software path prediction computer 130.

The time series real-time software event data (TSRTSED) is received or retrieved via stream 102 by the software path prediction computer (SPPC) 130. The SPPC 130 is configured to compress the stream 102 of TSRTSED to form a compressed TSRTSED that is then stored by the SPPC 130 in the first datastore 150. After passage of a period of time over which the compressed TSRTSED is stored in the first datastore 150, the SPPC 130 is configured to retrieve a time segmented data batch (TSDB) comprising the compressed TSRTSED stored over the period of time in the first datastore 150. The period of time can be 1, 2, 3, 4, 5, 6, 7, 8, 9, 10, 15, 20, 25, 30, 35, 40, 45, 50, 55, or 60 minutes; alternatively, 1, 2, 3, 4, 5, 6, 7, 8, 9, 10, 11, 12, 13, 14, 15, 16, 17, 18, 19, 20, 21, 22, 23, or 24 hours; alternatively, 1, 2, 3, 4, 5, 6, or 7 days. For example, the TSBD can contain all compressed TSRTSED that was stored on the first datastore 150 during the previous 1 hour, or during the previous 1 day. After the TSDB associated with a period of time is retrieved, the SPPC 130 can erase the compressed TSRTSED the was stored during the period of time from the first datastore 150; alternatively, the SPPC 130 can leave the compressed TSRTSED that was stored during the period of time stored on the first datastore 150; alternatively, the SPPC 130 can be configured to send the compressed TSRTSED to another datastore for historical archiving. In embodiments, after the TSDB associated with the period of time is retrieved, the SPPC 130 is configured to continue receiving the TSRTSED via stream 102, compressing the TSRTSED, store the compressed TSRTSED in the first datastore 150, and retrieve another TSDB comprising compressed TSRTSED that was stored in the first datastore 150 during a subsequent period of time. Each TSDB that is retrieved by the SPPC 130 is sent to the segmentation machine learning model 220 as TSDB 201 and to the ensemble machine learning model 230 as TSDB 202 in FIG. 2. TSDB 201 and TSDB 202 duplicate batches of the same time segmented data associated with the period of time over which the compressed TSRTSED was stored in the first datastore 150.

In aspects, the SPPC 130 can compress the TSRTSED by greater than 50, 60, 70, 80, or 90% to form the compressed TSRTSED. In additional or alternative aspects, a ratio of a size of the compressed TSRTSED to a size of the TSRTSED before compression is less than 0.5:1, 0.4:1, 0.3:1, 0.2:1, or 0.1:1.

The SPPC 130 is configured to perform the segmentation machine learning model 220 on the TSDB 201 to produce segmentation output 203. In embodiments, the SPPC 130 is configured to perform the segmentation machine learning model 220 on the TSDB 201 to produce a segmentation output 203 after every occurrence of the period of time (repeated performance at predefined intervals of time), for example, every time a TSDB 201 is received. In aspects, the segmentation machine learning model 220 can be configured to segment the TSDB 201 into one or more user groups to obtain the segmentation output 203.

The segmentation machine learning model 220 can include one or more machine learning algorithms that are configured to segment the TSDB into groups for each software customer and groupings having common attributes. A first level of segmentation can group all user identifiers and data associated with the user identifiers according to software customer. For example, all user identifiers and associated data for a video game software as a first software customer can be placed in a group, while all user identifiers and associated data for a tutoring app as a second software customer can be placed in a separate group. A second level of segmentation, or sub-segmentation, can include grouping user identifiers in a software customer segment into subgroups of user identifiers having one or more common or related attributes. Attributes can relate to geographic attributes, demographic attributes, behavioral attributes, psychographic attributes, or combinations thereof, associated with users of the software clients on devices 110 in FIG. 1 that send the software event data to the data ingestion computer 120. For example, in the context of video gaming, the segmentation machine learning model 220 can have one or more ML algorithms configured to segment different software clients (i.e., unique to the users of the devices running the software of the software customer, e.g., video game X) into groups based on various attributes associated with gaming, such as age, geo-location, play time per game, play time per day or week or month or years, skill level, number of games played, types of games played, historical sequence of software paths taken by a gamer, or combinations thereof. ML algorithms that can be included in the segmentation machine learning model 220 can include K-means clustering, segmentation regression algorithms, density-based spatial clustering of applications with noise (DBSCAN), or combinations thereof.

The SPPC 130 is configured to perform each of a plurality of machine learning models in an ensemble machine learning model 230 on an input data set that includes the TSDB 202 and the segmentation output 203. The ensemble machine learning model 230 can include 2, 3, 4, 5, 6, 7, 8, 9, 10, or more machine learning models; alternatively, 2, 3, 4, 5, 6, 7, 8, 9, or 10 models; alternatively, 2, 3, 4, 5, 6, 7, or 8 models; alternatively, 3, 4, 5, 6, or 7 models; alternatively, 4, 5, or 7 models; alternatively, 5 models. The machine learning models in the ensemble machine learning model 230 can include one or more linear regression machine learning models, one or more deep learning (neural network) models, one or more random force models, models that are a combination of different types of ML algorithms run in series and/or parallel, or combinations thereof.

The ensemble machine learning model 230 is configured to build or construct test feature sets for input to the machine learning models in the ensemble machine learning model 230. The test feature sets are randomized by the ensemble machine learning model 230 and then a test feature set is input into each machine learning model.

Each of the machine learning models in the ensemble machine learning model 230 is performed against a test set of software paths taken by users of the software running on devices 110. To determine a respective test set of software paths, each machine learning model can be configured to, for each user identifier contained in the TSDB 202, identify the historical software path(s) associated with user identifier, identify software path(s) that can qualify as potential desired software paths, analyze the performance or behavior associated with the user identifier, and select one or more software paths that are then identified as the desired software path(s) associated with the user identifier. Each machine learning model performs the analysis for the data associated with each user identifier and a test set of software paths for all user identifiers in the TSDB 202 is generated for each of the machine learning models.

In embodiments, the SPPC 130 can be configured to generate a confusion matrix for the test set of software paths for each machine learning model to produce a confidence level for each machine learning model. The confusion matrix can be compared with threshold confusion values, where the threshold confusion values are unique and set by the SPPC 130 for each software customer.

In some embodiments the input data set for the ensemble machine learning model 230 can include software path options. In embodiments, the software path options can be associated with an identifier that is unique to a user of one of the devices 110 running software that is or has ability to be a software client of the SPPC 130. The SPPC 130 can retrieve and send software path options from a software path option datastore 170 to the ensemble machine learning model 230. Examples of software path options include the levels to play in a video game, loyalty reward presentations, tutorial steps, or presentation of promotional offers. The SPPC 130 can be configured to receive software path options via a web interface 270 and to store the software path options in the datastore 170. The web interface 270 can be utilized by an administrator of the SPPC 130 to enter software path options into the datastore 170. For example, an administrator can obtain software path options for a user or particular type (group) of users, and enter the software path options into the datastore 170, so that the ensemble machine learning model 230 can be performed on an input data set containing the software path options.

The SPPC 130 is configured to select, or identify and then select, a most accurate model from the machine learning models of the ensemble machine learning model 230 based on performing each of the machine learning models on the input data set that includes the TSDB 202, the segmentation output 203, and optionally, the software path options 204. In embodiments, the SPPC 130 is configured to select or identify and then select a most accurate model from the machine learning models of the ensemble machine learning model 230 based on the confusion matrix threshold test.

The SPPC 130 is configured to send the most accurate model to the server program 250 via stream 205, and to load the most accurate model onto the server program 250. For clarification, "load", "loading", or variations thereof with reference to the most accurate model on or to the server program 250 has different meaning than the "loading" performed by the data ingestion computer 120. Model 251 illustrated in the server program 250 represents the model that is loaded onto the server program 250 after the most accurate model is selected by the SPPC 130 and loaded onto the server program 250 by the SPPC 130. The machine learning algorithm or combination of machine learning algorithms that are contained in the loaded model 251 can change over time, after the most accurate model is selected by the SPPC 130 every time a TSDB 201 and 202 is processed by the models 220 and 230. If the most accurate model is not the one loaded on the server program 250, the server program 250 can be updated with the most recently accurate model. The server program 250 can then perform the most recently accurate model associated with a most recent period of time on additional feature set(s) that are generated by the server program 250 in response to subsequent request(s). It should be noted that the most accurate model is not sent to the software client running on any of devices 110; instead, the most accurate model remains in the SPPC 130 on the server program 250, and the disclosed techniques are thus not dependent upon user device processing power to run the most accurate model to determine next software path for a software client. Put another way, the disclosed embodiments keep processing demands for determining predicted software path(s) away from the client level and place the demands at the server level.

The SPPC 130 is configured to perform the most accurate model that is loaded thereon (e.g., model 251 or a most recently accurate model subsequently loaded thereon) on a feature set that is input into the model (e.g., model 251) to obtain an output of predicted software path(s) for a software client. This output will be described in more detail below.

Concurrently with storing compressed TSRTSED in the first datastore 150, the SPPC 130 is configured to store uncompressed TSRTSED in the second datastore 160. The second datastore 160 can be embodied as a fast-access datastore, for quick retrieval of software event data that is unique to a software client. In embodiments, the SPPC 130 can be configured to associate TSRTSED with a time stamp, user of the software client, device, software client, or combinations thereof, and to store the association(s) in the second datastore 160. Updating the model 251 that is loaded on the server program 250 is discussed in more detail herein.

The server program 250 is configured to perform a service for software clients. In particular, the server program 250 is configured to provide predicted software path options to a software client after the software client requests software path options. Each device 110 in FIG. 1 has software executed thereon that can be the software client of the server program 250. Every time the software of a device 110 requests predicted software paths from the SPPC 130, the software is the software client of the server program 250 running on the SPPC 130.

The functionality of the server program 250 will be described with reference to device 110a of the devices 110 in FIG. 1; however, it is to be understood that any of the devices 110 (e.g., 110a, 110b, 110n) can send a request for precited software paths to the server program 250 of the SPPC 130 and receive predicted software path(s) from the server program 250 of the SPPC 130.

The server program 250 can be configured to receive a request 103 for predicted software paths for the software client running on device 110a. The request can include an identifier unique to a user of the device 110a that is running the software client (e.g., the "user identifier" described herein).

The server program 250 can be configured to retrieve the TSRTSED 206 from the second datastore 160, in response to receiving the request 103. In embodiments, the server program 250 is configured to retrieve from the second datastore 160 only the TSRTSED 206 that is associated with the user identifier in the request 103.

The server program 250 can be configured to build or construct the feature set that is to be input to the model 251 loaded on the server program 250. The feature set can be built or constructed based on the TSRTSED 206 that is retrieved from the second datastore 160, and building or constructing the feature set is dynamically accomplished by the server program 250 after retrieving the TSRTSED 206. In embodiments, the feature set is unique to a user of the device 110a running the software client that made the request 103 because the feature set is constructed based on the TSRTSED 206 that is associated with the user identifier in the request 103.

The server program 250 can be configured to input the feature set to the model 251 that is loaded on the server program 250 to obtain the predicted software path(s). The server program 250 can then perform the model 251 on the feature set to produce an output containing predicted software paths for the software client running on the device 110a that made the request 103. The predicted software paths can include 1, 2, 3, 4, 5, 6, 7, 8, 9, or 10 predicated software paths, for example. In embodiments, the number of predicted software paths that can be predicted is significantly fewer than the number of software paths that would otherwise be predicted based only upon input of segmentation data (e.g., equal to or less than 10 paths compared with up to millions of paths).

The server program 250 can be configured to send the predicted software path(s) 104 to the device 110a running the software client that sent the request 103 for the predicted software path(s). The device 110a can then execute the software on the device 110a such that one or more of the predicted software path(s) 104 is/are the next software path(s) executed by the software and that the user of the device 110a experiences.

The server program 250 can be configured to send feedback 105 to the data ingestion computer 120 for processing with the software event data received via stream 101. In embodiments, the feedback 105 includes the predicted software path(s) that were generated by the model 251 loaded and running on the server program 250. In embodiments, the server program 250 can associate the predicted software path(s) with the user identifier contained in the request 103, and the server program 250 can include the association and the predicted software paths in the feedback 105. Sending the predicted software path(s) and optional association with the user identifier in feedback 105 to the data ingestion computer 120 provides for closed loop feedback for the computer system 100 in FIG. 1 and for the SPPC 130 in FIGS. 1 and 2 because the predicted software paths can be compared with the actual software paths executed on the device, and the models 220 and 230 can continue to learn the behavior and continuously improve prediction accuracy.

In embodiments, the predicted software path(s) received by the data ingestion computer 120 can be associated by the data ingestion computer 120 with the software event data that was generated by the device 110a in response to the device 110a receiving the predicted software path(s) 104, such that a comparison of the predicted software path(s) with the actual software path(s) executed by the software client that made the request 103 can be made by the data ingestion computer 120, the segmentation machine learning model 220, the ensemble machine learning model 230, or combinations thereof.

Continuous operation will be described with reference to FIGS. 1 and 2. During operation, the devices 110 having software client(s) running thereon continuously send a stream 101 of software event data to the data ingestion computer 120. The data ingestion computer 120 continuously receives the software event data via stream 101 and converts the software event data and any feedback 105 received from the server program 250 to the TSRTSED 102 that is continuously sent to the SPPC 130.

The SPPC 130 continuously compresses the TSRTSED 102 as it is received to produce compressed TSRTSED that the SPPC 130 continuously stores in the first datastore 150, while the SPPC 130 continuously stores the TSRTSED 102 in the second datastore 160 (without compression).

From this point, the first datastore 150 is ready for periodic access by the SPPC 130 at predefined intervals (period of time) so that the SPPC 130 can provide the TSDB 201 to the segmentation machine learning model 220 and the TSDB 202 to the ensemble machine learning model 230 after every occurrence of the period of time. Additionally, the second datastore 160 is ready for on-call fast access by the server program 250 running on the SPPC 130, where the server program 250 accesses the second datastore 160 to retrieve TSRTSED 206 associated with a user identifier in real-time response to a request 103 received by the server program 250 from a software client running on a device (e.g., device 110a).

The segmentation machine learning model 220 and the ensemble machine learning model 230 can run after every occurrence of the period of time defined by the predefined time intervals, to determine a most accurate model; while the server program 250 concurrently is available and on-call for software client requests (e.g., request 103) with a model 251 loaded thereon, where the model 251 was previously determined by the ensemble machine learning model 230 to be the most accurate model at the previous occurrence of the time interval.

The server program 250 receives requests from software clients and provides predicted software path(s) as described above using the model 251 that is loaded thereon until the model 251 is updated by the SPPC 130 when another model is determined by the SPPC 130 to be more accurate that the currently loaded model 251.

The SPPC 130 can periodically (e.g., hourly, every 2, 3, 4, 5, 6, 7, 8, 9, 10, 11, 12, 13, 14, 15, 16, 17, 18, 19, 20, 21, 22, or 23 hours, daily) update the server program 250 with the most recently accurate model associated with a most recent period of time on feature set(s) that are generated by the server program 250 in response to subsequent request(s) (like request 103, but later in time).

Updating will be described with reference to the model 251 loaded on the server program 250 as the first machine learning model that was previously selected as most accurate of the models in the ensemble machine learning model 230, and the model in the ensemble machine learning model 230 that becomes more accurate than the first machine learning model is called the second machine learning model. In some embodiments, updating the server program 250 can include determining a second machine learning model of the plurality of machine learning models in the ensemble machine learning model 230 is more accurate than the first machine learning model, identifying the second machine learning model as the most accurate model based on the step of determining; updating the server program 250 with the second machine learning model as the most accurate model 251 loaded on the server program 250, and performing, by the server program 250, the second machine learning model on another feature set to obtain another output comprising another predicted software path for the software client or another software client running on the device 110a or another device (e.g., device 110b, 110n).

In embodiments, determining the second machine learning model is more accurate than the first machine learning model can include performing the segmentation machine learning model 220 on a second time segmented data batch (TSDB) to obtain a second segmentation output, performing each of the plurality of machine learning models in the ensemble machine learning model 230 on a second input data set comprising the second TSDB and the second segmentation output, and determining an accuracy of the first machine learning model loaded on the server program 250 as the most accurate model 251 is less than an accuracy of the second machine learning model of the plurality of machine learning models in the ensemble machine learning model 230.

The disclosed methods can generally include any of the functionality of the components 110, 120, and 130 described herein, and are described with reference to the reference numerals in FIGS. 1 and 2.

Figure 3:
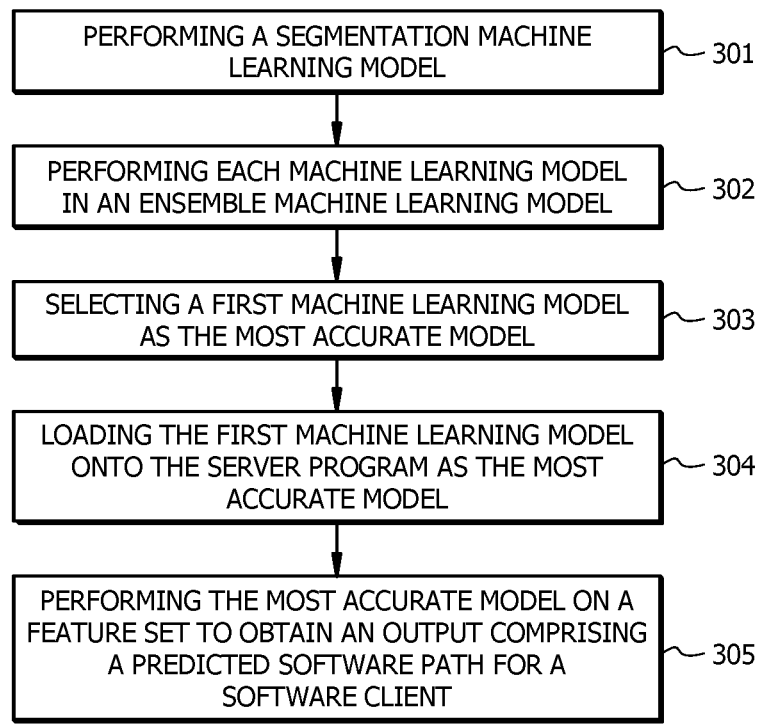
FIG. 3 illustrates a flow diagram of the disclosed method.

FIG. 3 illustrates a flow diagram of the disclosed method 300.

In block 301, the method 300 can include performing a segmentation machine learning model 220 on a time segmented data batch (TSDB) 201 to obtain a segmentation output 203. The performing step in block 301 can be performed by the SPPC 130. Other embodiments, aspects, and details of performing a segmentation machine learning model 220 are discussed hereinabove and are not reproduced here.

In block 302, the method 300 can include performing each of a plurality of machine learning models in an ensemble machine learning model 230 on an input data set comprising the TSDB 202 and the segmentation output 203. The performing step in block 302 can be performed by the SPPC 130. Other embodiments, aspects, and details of performing an ensemble machine learning model 230 are discussed hereinabove and are not reproduced here.

In block 303, the method 300 can include selecting a first machine learning model from the plurality of machine learning models in the ensemble machine learning model 230 as a most accurate model based on the step of performing in block 302. The selecting step in block 303 can be performed by the SPPC 130. Other embodiments, aspects, and details of selecting the first machine learning model are discussed hereinabove and are not reproduced here.

In block 304, the method 300 can include loading the first machine learning model onto the server program 250 as the most accurate machine model. The loading step in block 304 can be performed by the SPPC 130. Other embodiments, aspects, and details of loading the first machine learning model are discussed hereinabove and are not reproduced here.

In block 305, the method 300 can include performing the most accurate model on a feature set to obtain an output comprising a predicted software path for a software client. The performing step in block 305 can be performed by the SPPC 130, and in embodiments, by the server program 250 of the SPPC 130. Other embodiments, aspects, and details of performing the most accurate model are discussed hereinabove and are not reproduced here.

Figure 4:
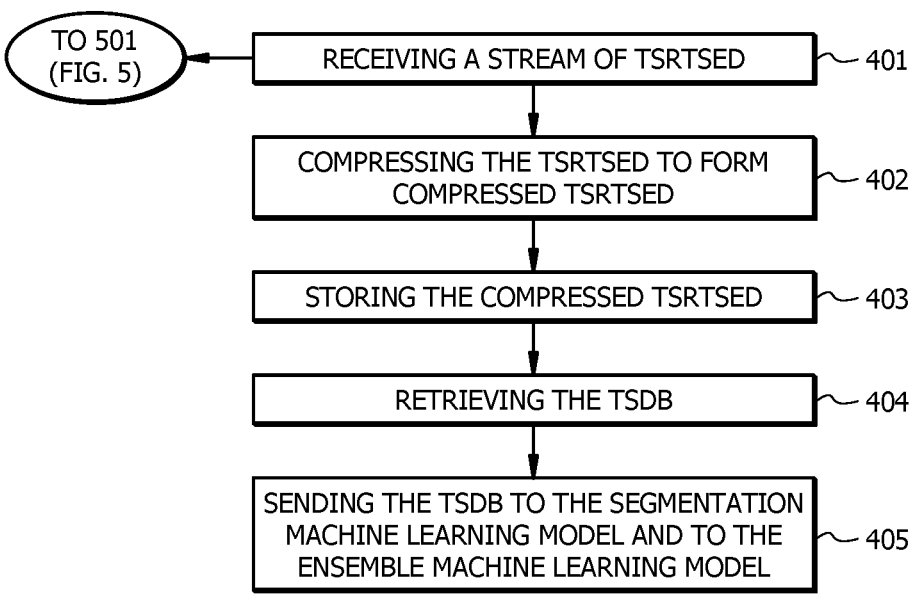
FIG. 4 illustrates a flow diagram of additional steps that can be performed in the method of FIG. 3.

FIG. 4 illustrates a flow diagram of additional steps that can be performed in the method 300 in FIG. 3.

In block 401, the method 300 can additionally include receiving a stream 102 of time series real-time software event data (TSRTSED). The SPPC 130 can received the stream 102 from the data ingestion computer 120. Block 401 is illustrated that the TSRTSED can be received, and the TSRTSED can be stored by proceeding to block 402 in FIG. 4, by proceeding to block 501 in FIG. 5, or by proceeding to both block 402 in FIG. 4 and block 501 in FIG. 5. Other embodiments, aspects, and details of receiving the TSRTSED are discussed hereinabove and are not reproduced here.

In block 402, the method 300 can additionally include compressing the TSRTSED to form a compressed TSRTSED. The SPPC 130 can compress the TSRTSED to from the compressed TSRTSED, in preparation for storage of the compressed TSRTSED in the first datastore 150. Other embodiments, aspects, and details of compressing the TSRTSED, such as compression % and ratio, are discussed hereinabove and are not reproduced here.

In block 403, the method 300 can additionally include storing the compressed TSRTSED. The compressed TSRTSED can be stored by the SPPC 130 in the first datastore 150. Other embodiments, aspects, and details of storing the compressed TSRTSED are discussed hereinabove and are not reproduced here.

In block 404, the method 300 can additionally include retrieving a time segmented data batch (TSDB) 201\202 comprising the compressed TSRTSED that is stored over a period of time. The TSDB 201/202 can be retrieved by the SPPC 130 from the first datastore 150 in which the compressed TSRTSED is stored. Other embodiments, aspects, and details of retrieving the compressed TSRTSED are discussed hereinabove and are not reproduced here.

In block 405, the method 300 can additionally include sending the TSDB 201/202 to the segmentation machine learning model 220 and to the ensemble machine learning model 230. That is, the method can include sending the TSDB 201 to the segmentation machine learning model 220 and sending the TSDB 202 to the ensemble machine learning model 230, where TSDB 201 and TSDB 202 are duplicates of one another. Other embodiments, aspects, and details of sending the TSDB 201/202 to the models 220 and 230 are discussed hereinabove and are not reproduced here.

The method steps illustrated in blocks 401 to 405 of FIG. 4 can generally be performed before the method steps illustrated in blocks 301 to 305 are performed. That is, in some embodiments, method 300 can include flow of through steps 401, 402, 403, 404, 405 and then through method steps 301, 302, 303, 304, and 305 illustrated in FIGS. 3 and 4. In other embodiments, method 300 can include flow of through steps 401, 402, 403, 404, 405, 301, 302, 303, and 304 illustrated in FIGS. 3 and 4, with step 305 performed independently of the performance of any of steps 301 to 304 and 401 to 405. In embodiments, steps 401 to 405 illustrated in FIG. 4 can be performed independently of step 305 illustrated in FIG. 3.

Figure 5:
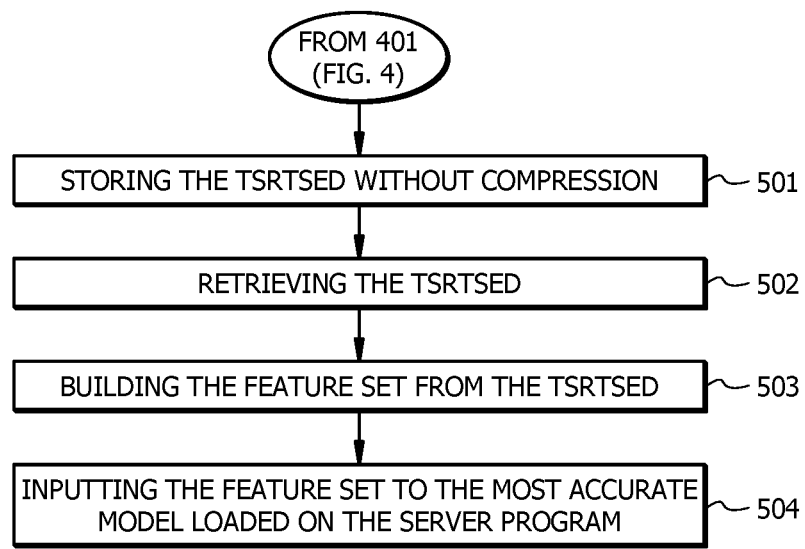
FIG. 5 illustrates a flow diagram of additional steps that can be performed in the method of FIG. 3.

FIG. 5 illustrates a flow diagram of additional steps that can be performed in the method 300.

In block 501, the method 300 can additionally include storing the TSRTSED in a second datastore 160. In embodiments, and as illustrated in FIGS. 4 and 5, the TSRTSED is received in block 401, and the TSRTSED that is stored in block 501 of FIG. 5 is the TSRTSED received in block 401 of FIG. 4. In embodiments, the TSRTSED is stored in the second datastore 160 without compression of the TSRTSED before storage. The SPPC 130 can store the TSRTSED in the second datastore 160. Other embodiments, aspects, and details of storing the TSRTSED in the second datastore 160 are discussed hereinabove and are not reproduced here.

In block 502, the method 300 can additionally include retrieving the TSRTSED from the second datastore 160. In embodiments, the TSRTSED is retrieved from the second datastore 160 by the SPPC 130. In additional embodiments, the server program 250 of the SPPC 130 retrieves the TSRTSED from the second datastore 160. In embodiments, the TSRTSED is TSRTSED 206 that is associated with the user identifier in a request 103 that is received by the server program 250 from a software client running on a device (e.g., device 110a). Other embodiments, aspects, and retrieving the TSRTSED from the second datastore 160 are discussed hereinabove and are not reproduced here. Other embodiments, aspects, and details of retrieving the TSRT- SED from the second datastore 160 are discussed hereinabove and are not reproduced here.

In block 503, the method 300 can additionally include building or constructing a feature set from the TSRTSED retrieved from the second datastore 160. In embodiments, the feature set is built or constructed by the SPPC 130. In additional embodiments, the feature set is built or constructed by the server program 250 of the SPPC 130. In embodiments, the feature set is unique to a user of the software client that is running on the device (e.g., device 110a). Other embodiments, aspects, and details of building or constructing the feature set from the TSRTSED that is retrieved from the second datastore 160 are discussed hereinabove and are not reproduced here.

In block 504, the method 300 can additionally include inputting the feature set to the most accurate model. In embodiments, as described above, the most accurate model runs on the SPPC 130, and in further embodiments, the most accurate model is loaded thereon on the server program 250. Other embodiments, aspects, and details of inputting the feature set to the most accurate model are discussed hereinabove and are not reproduced here.

In embodiments, the SPPC 130 can perform the method steps of blocks 502 to 504 in FIG. 5 and of blocks 402 to 405 in FIG. 4 concurrently. The method steps illustrated in blocks 501 to 504 generally can be performed independently of the method steps illustrated in blocks 402 to 405 of FIG. 4. In embodiments, the method steps of blocks 402 to 405 and the method steps of block 501 to 504 are performed after the method step of block 401. The method steps illustrated in blocks 501 to 504 can generally be performed independently of the method steps 301 to 305 that are illustrated in FIG. 3.

Figure 6:
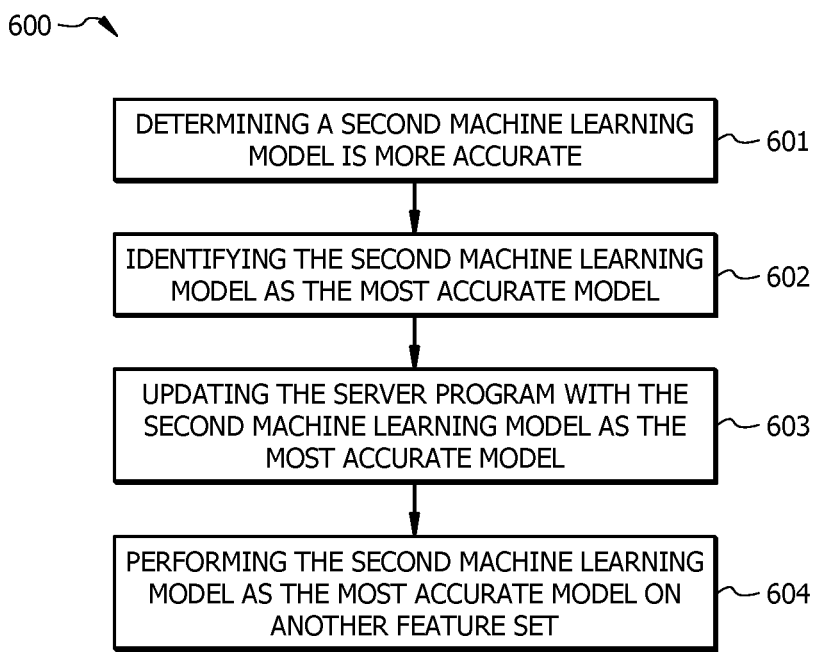
FIG. 6 illustrates a flow diagram of a method for updating the most accurate model loaded on the server program.

FIG. 6 illustrates a flow diagram of a method 600 for updating the most accurate model in the server program 250. The method 600 in FIG. 6 can be performed in combination with any combination of steps in FIG. 1, FIG. 2, FIG. 3, FIG. 4, FIG. 5, or combinations of FIGS. 1-5.

In block 601, the method 600 can include determining a second machine learning model of the plurality of machine learning models in the ensemble machine learning model 230 is more accurate than the first machine learning model that is currently loaded on the server program 250. In embodiments, the SPPC 130 can perform the determining step in block 601. Other embodiments, aspects, and details of the method step in block 601 are discussed hereinabove and are not reproduced here.

In block 602, the method 600 can include identifying the second machine learning model as the most accurate model based on the step of determining that is performed in block 601. In embodiments, the SPPC 130 can perform the identifying step in block 602. Other embodiments, aspects, and details of the method step in block 602 are discussed hereinabove and are not reproduced here.

In block 603, the method 600 can include updating the server program 250 with the second machine learning model as the most accurate model loaded on the server program 250. In embodiments, the SPPC 130 can perform the updating step in block 603. Other embodiments, aspects, and details of the method step in block 603 are discussed hereinabove and are not reproduced here.

In block 604, the method 600 can include performing the second machine learning model as the most accurate model on another feature set to obtain another output comprising another predicted software path for the software client running on a device (e.g., device 110a) or another software client running on another device (e.g., device 110b). In embodiments, the SPPC 130 can perform the performing step in block 604. In additional embodiments, the server program 250 of the SPPC 130 can perform the performing step in block 604. Other embodiments, aspects, and details of the method step in block 604 are discussed hereinabove and are not reproduced here.

While examples used in this description include video games and tutorials. It is contemplated that the disclosed computer system, computer, and method can be applied in various other applications, and the disclosure it not to be limited to video game and tutorial applications.

While portions of the disclosure illustrated in the various figures can be illustrated as individual components, such as computers or modules, that implement described features and functionality using various objects, methods, or other processes, the disclosure can also include a number of other computers, sub-modules, third-party services, and other components. Conversely, the features and functionality of various components can be combined into single components, as appropriate. Thresholds used to make computational determinations can be statically, dynamically, or both statically and dynamically determined.

What is claimed is:

1. A method comprising:
receiving a stream of time series real-time software event data (TSRTSED);
compressing the TSRTSED to form a compressed TSRTSED;
storing, in a first datastore of a software path prediction computer, the compressed TSRTSED;
retrieving, from the first datastore, a time segmented data batch (TSDB) comprising the compressed TSRTSED that is stored over a period of time;
sending the TSDB to a segmentation machine learning model and to an ensemble machine learning model;
concurrently with storing the compressed TSRTSEd in the first datastore, storing, in a second datastore of the software path prediction computer, an uncompressed TSRTSED that is the TSRTSED stored without compression;
performing the segmentation machine learning model on the TSDB to obtain a segmentation output;
performing each of a plurality of machine learning models in the ensemble machine learning model on an input data set comprising the TSDB and the segmentation output;
selecting a first machine learning model from the plurality of machine learning models in the ensemble machine learning model based on the step of performing each of the plurality of machine learning models in the ensemble machine learning model on an input data set;
loading the first machine learning model onto a server program;
retrieving, by the server program, the uncompressed, TSRTSED from the second datastore;
building, by the server program, a feature set from the uncompressed TSRTSED retrieved from the second datastore, wherein the feature set is unique to a user of a software client;
inputting, by the server program, the feature set to the first machine learning model loaded thereon; and
performing, by the server program, the first machine learning model on the feature set to obtain an output comprising a predicted software path for the software client.

2. The method of claim 1, wherein the step of compressing compresses the received TSRTSED by greater than 50% to form the compressed TSRTSED.

3. The method of claim 2, wherein a ratio of a size of the compressed TSRTSED to a size of the TSRTSED is less than 0.5:1.

4. The method of claim 1, further comprising:
sending, by the server program, a feedback containing the predicted software path to a data ingestion computer that is configured to include the feedback in the TSRTSED.

5. The method of claim 1, further comprising:
receiving a request for the predicted software path from the software client, wherein the request comprises an identifier unique to a user of the software client; and
sending the predicted software path to the software client.

6. The method of claim 1, wherein the segmentation machine learning model is configured to segment the TSDB into a plurality of user groups to obtain the segmentation output.

7. The method of claim 1, further comprising:
storing software path options on a third datastore;
wherein the input data set further comprises the software path options.

8. The method of claim 1, further comprising:
determining a second machine learning model of the plurality of machine learning models in the ensemble machine learning model is more accurate than the first machine learning model;
identifying the second machine learning model based on the step of determining;
updating the server program by loading the second machine learning model on the server program; and
performing, by the server program, the second machine learning model on another feature set to obtain another output comprising another predicted software path for the software client or another software client.

9. The method of claim 8, wherein the step of determining comprises:
performing the segmentation machine learning model on a second time segmented data batch (TSDB) to obtain a second segmentation output;
performing each of the plurality of machine learning models in the ensemble machine learning model on a second input data set comprising the second TSDB and the second segmentation output; and
determining an accuracy of the first machine learning model loaded on the server program is less than an accuracy of the second machine learning model of the plurality of machine learning models in the ensemble machine learning model.

10. The method of claim 1, wherein the server program is periodically updated to perform a most recently accurate model on additional feature sets.

11. A computer system comprising:
a software path prediction computer having a first datastore, a second datastore, and a server program running thereon, wherein the software path prediction computer is configured to:
receive a stream of time series real-time software event data (TSRTSED);
compress the TSRTSED to form a compressed TSRTSED;
store, in the first datastore, the compressed TSRTSED;
retrieve, from the first datastore, a time segmented data batch (TSDB) comprising the compressed TSRTSED that is stored over a period of time;
send the TSDB to a segmentation machine learning model and to an ensemble machine learning model;
concurrently with storing the compressed TSRTSED in the first datastore, store, in the second datastore, an uncompressed TSRTSED that is the TSRTSED stored without compression;
perform the segmentation machine learning model on the TSDB to obtain a segmentation output;
perform each of a plurality of machine learning models in the ensemble machine learning model on an input data set comprising the TSDB and the segmentation output;
select a first machine learning model from the plurality of machine learning models in the ensemble machine learning model based on the step of performing each of the plurality of machine learning models in the ensemble machine learning model on an input data set; and
load the first machine learning model onto a server program;
wherein the server program is configured to:
retrieve the uncompressed TSRTSED from the second datastore;
build a feature set from the uncompressed TSRTSED retrieved from the second datastore, wherein the feature set is unique to a user of a software client;
input the feature set to the first machine learning model loaded on the server program; and
perform the first machine learning model on the feature set to obtain an output comprising a predicted software path for the software client.

12. The computer system of claim 11, wherein the software path prediction computer is further configured to:
determine a second machine learning model of the plurality of machine learning models in the ensemble machine learning model is more accurate than the first machine learning model;
identify the second machine learning model based on the step of determining; and
update the server program by loading the second machine learning model on the server program;
wherein the server program is further configured to perform the second machine learning model on another feature set to obtain another output comprising another predicted software path for the software client or another software client.

13. The computer system of claim 11, wherein the software path prediction computer is networked with a device running the software client, wherein the server program of the software path prediction computer is configured to receive a request for the predicted software path from the device and to send the predicted software path to the device.

14. The computer system of claim 11, further comprising:
a data ingestion computer networked with the software path prediction computer, wherein the data ingestion computer is configured to receive a stream of software event data, to convert the software event data to time series real-time software event data (TSRTSED), and to send the TSRTSED to the software path prediction computer.

15. A non-transitory computer-readable medium storing computer readable instructions that, when executed by one or more computing devices of a software path prediction computer, causes the software path prediction computer to perform operations comprising:
receiving a stream of time series real-time software event data (TSRTSED);

compressing the TSRTSED to form a compressed TSRT-SED;

storing, in a first datastore of the software path prediction computer, the compressed TSRTSED;

retrieving, from the first datastore, a time segmented data batch (TSDB) comprising the compressed TSRTSED that is stored over a period of time;

sending the TSDB to a segmentation machine learning model and to an ensemble machine learning model;

concurrently with storing the compressed TSRTSED in the first datastore, storing, in a second datastore of the software path prediction computer, an uncompressed TSRTSED that is the TSRTSED stored without compression;

performing the segmentation machine learning model on the TSDB to obtain a segmentation output;

performing each of a plurality of machine learning models in the ensemble machine learning model on an input data set comprising the TSDB and the segmentation output;

selecting a first machine learning model from the plurality of machine learning models in the ensemble machine learning model based on the step of performing each of the plurality of machine learning models in the ensemble machine learning model on an input data set;

loading the first machine learning model onto a server program;

retrieving the uncompressed TSRTSED from the second datastore;

building a feature set from the uncompressed TSRTSED retrieved from the second datastore, wherein the feature set is unique to a user of a software client;

inputting the feature set to the first machine learning model; and performing, by the server program, the first machine learning model on the feature set to obtain an output comprising a predicted software path for the software client.

* * * * *